US008710537B2

(12) United States Patent
Engl et al.

(10) Patent No.: US 8,710,537 B2
(45) Date of Patent: Apr. 29, 2014

(54) RADIATION-EMITTING SEMICONDUCTOR CHIP AND METHOD FOR PRODUCING A RADIATION-EMITTING SEMICONDUCTOR CHIP

(75) Inventors: Karl Engl, Niedergebraching (DE); Berthold Hahn, Hemau (DE); Klaus Streubel, Laaber (DE); Markus Klein, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 20 days.

(21) Appl. No.: 12/922,736

(22) PCT Filed: Jun. 25, 2009

(86) PCT No.: PCT/DE2009/000885
§ 371 (c)(1),
(2), (4) Date: Aug. 10, 2011

(87) PCT Pub. No.: WO2010/009690
PCT Pub. Date: Jan. 28, 2010

(65) Prior Publication Data

US 2012/0018763 A1 Jan. 26, 2012

(30) Foreign Application Priority Data

Jul. 24, 2008 (DE) ......................... 10 2008 034 560

(51) Int. Cl.
*H01L 33/38* (2010.01)

(52) U.S. Cl.
USPC ......................... 257/99; 257/E33.065; 438/23

(58) Field of Classification Search
CPC . H01L 33/382; H01L 27/0248; H01L 25/167; H01L 33/387; H01L 27/15
USPC ......................... 257/99, E33.065, 79; 438/23
See application file for complete search history.

(56) References Cited

U.S. PATENT DOCUMENTS 7,064,353 B2 6/2006 Bhat
7,683,383 B2 3/2010 Hong et al.
7,693,201 B2 4/2010 Albrecht et al.
2002/0179914 A1 12/2002 Sheu
2005/0056855 A1 3/2005 Lin et al.

(Continued)

FOREIGN PATENT DOCUMENTS

CN 1588657 A 3/2005
CN 1886874 A 12/2006

(Continued)

OTHER PUBLICATIONS

Schnitzer, I. et al., "30% External Quantum Efficiency from Surface Textured Thin-Film Light-Emitting Diodes," *Applied Physics Letters*, Oct. 18, 1993, vol. 63, No. 16, pp. 2174-2176.

(Continued)

*Primary Examiner* — Yu Chen
(74) *Attorney, Agent, or Firm* — DLA Piper LLP (US)

(57) ABSTRACT

A radiation-emitting semiconductor chip includes: a carrier and a semiconductor body with a semiconductor layer sequence including an active region that generates radiation, a first semiconductor layer and a second semiconductor layer; wherein the active region is arranged between the first semiconductor layer and the second semiconductor layer; the first semiconductor layer is arranged on a side of the active region which faces away from the carrier; the semiconductor body comprises at least one recess which extends through the active region; the first semiconductor layer is electrically conductively connected to a first connection layer extending in the recess from the first semiconductor layer in a direction of the carrier; and the first connection layer is electrically connected to the second semiconductor layer via a protective diode.

24 Claims, 5 Drawing Sheets

(56) References Cited

U.S. PATENT DOCUMENTS

| | | | | |
|---|---|---|---|---|
| 2005/0156177 | A1 | 7/2005 | Lin et al. | |
| 2006/0056123 | A1 * | 3/2006 | Aoyagi et al. | 361/56 |
| 2006/0060880 | A1 | 3/2006 | Lee et al. | |
| 2006/0081857 | A1 * | 4/2006 | Hong et al. | 257/84 |
| 2007/0069218 | A1 | 3/2007 | Chen et al. | |
| 2007/0246716 | A1 | 10/2007 | Bhat et al. | |
| 2007/0258500 | A1 | 11/2007 | Albrecht et al. | |
| 2007/0284606 | A1 | 12/2007 | Sugimori | |

FOREIGN PATENT DOCUMENTS

| | | | |
|---|---|---|---|
| CN | 101051630 | A | 10/2007 |
| DE | 101 47 886 | A1 | 4/2003 |
| DE | 10 2004 005 269 | A1 | 6/2005 |
| DE | 10 2004 012 219 | A1 | 6/2005 |
| DE | 10 2005 043 649 | A1 | 4/2006 |
| JP | 2007/512689 | | 5/2007 |
| JP | 2007-294981 | | 11/2007 |
| KR | 10 2006 0062 715 | A | 6/2006 |
| WO | 01/22495 | A1 | 3/2001 |

OTHER PUBLICATIONS

Shei, S-C. et al., “Improved Reliability and ESD Characteristics of Flip-Chip GaN-Based LEDs with Internal Inverse-Parallel Protection Diodes,” *IEEE Electron Device Letters*, May 2007, vol. 28, No. 5, pp. 346-349.

* cited by examiner

RADIATION-EMITTING SEMICONDUCTOR CHIP AND METHOD FOR PRODUCING A RADIATION-EMITTING SEMICONDUCTOR CHIP

RELATED APPLICATIONS

This is a §371 of International Application No. PCT/DE2009/000885, with an international filing date of Jun. 25, 2009 (WO 2010/009690 A1, published Jan. 28, 2010), which is based on German Application No. 10 2008 034 560.1, filed on Jul. 24, 2008, the subject matter of which is incorporated by reference.

TECHNICAL FIELD

This disclosure relates to a radiation-emitting semiconductor chip and to a method for producing a radiation-emitting semiconductor chip.

BACKGROUND

In radiation-emitting semiconductor chips, for example, in light-emitting diodes, electrostatic discharge can lead to damage which can result in destruction. Such damage can be avoided by an additional diode connected in parallel with the semiconductor chip, wherein the forward direction of the diode and the forward direction of the radiation-emitting semiconductor chip are directed in antiparallel with respect to one another. This additional diode increases both the space requirement and the production costs. Furthermore, such an additional diode can lead to the absorption of radiation, as a result of which the usable optical power of the component is reduced.

It could therefore be helpful to provide a radiation-emitting semiconductor chip which has a reduced sensitivity toward electrostatic discharge. Furthermore, it could be helpful to provide a method for producing such a radiation-emitting semiconductor chip.

SUMMARY

We provide a radiation-emitting semiconductor chip comprising: a carrier and a semiconductor body with a semiconductor layer sequence comprising an active region that generates radiation, a first semiconductor layer and a second semiconductor layer; wherein the active region is arranged between the first semiconductor layer and the second semiconductor layer; the first semiconductor layer is arranged on a side of the active region which faces away from the carrier; the semiconductor body comprises at least one recess which extends through the active region; the first semiconductor layer is electrically conductively connected to a first connection layer extending in the recess from the first semiconductor layer in a direction of the carrier; and the first connection layer is electrically connected to the second semiconductor layer via a protective diode.

We also provide a method for producing a radiation-emitting semiconductor chip comprising: a) providing a semiconductor body with a semiconductor layer sequence including an active region that generates radiation, a first semiconductor layer and a second semiconductor layer; b) forming a recess in the semiconductor body which extends through the active region into the first semiconductor layer; c) forming a first connection layer on the semiconductor body, the first connection layer extends into the recess, and the first connection layer is electrically connected to the second semiconductor layer via a protective diode; and d) completing the semiconductor chip.

DETAILED DESCRIPTION

Figure 1A:
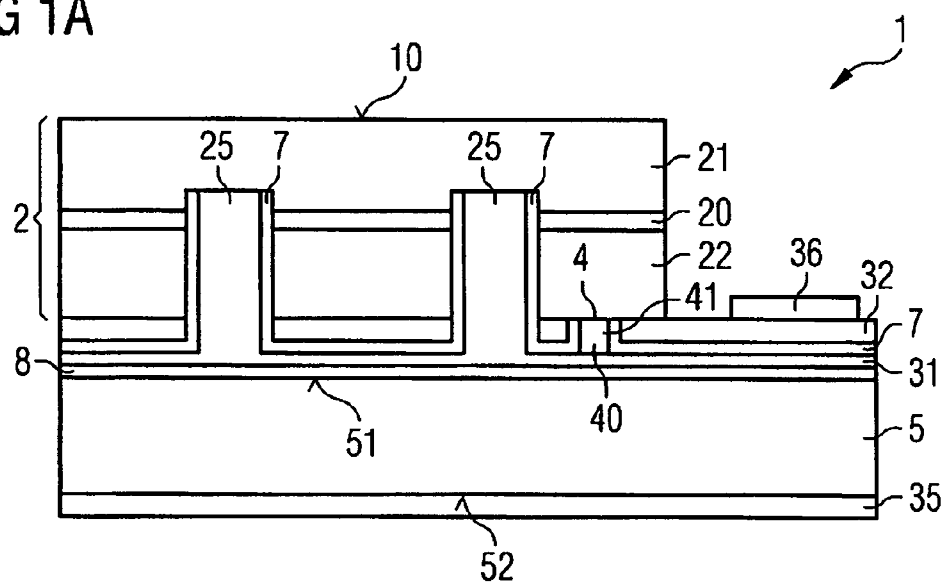
FIGS. 1A and 1B show an example of a radiation-emitting semiconductor chip in schematic plan view (FIG. 1B) and associated sectional view (FIG. 1A).

A radiation-emitting semiconductor chip comprises a carrier and a semiconductor body with a semiconductor layer sequence. The semiconductor layer sequence comprises an active region provided for generating radiation, a first semiconductor layer and a second semiconductor layer. The active region is arranged between the first semiconductor layer and the second semiconductor layer. The first semiconductor layer is arranged on that side of the active region which faces away from the carrier. The semiconductor body comprises at least one recess which extends through the active region. The first semiconductor layer is electrically conductively connected to a first connection layer, wherein the first connection layer extends in the recess from the first semiconductor layer in the direction of the carrier. The first connection layer is electrically connected to the second semiconductor layer via a protective diode.

In the case of a semiconductor chip, the protective diode is integrated into the semiconductor chip. The risk of damage to the semiconductor chip, for instance on account of electrostatic discharge, is thus reduced. An additional protective diode that is to be arranged outside the semiconductor chip and electrically conductively connected thereto can be dispensed with.

In particular, an undesirable voltage present, for instance, at the semiconductor chip or a radiation-generating pn junction formed therein in the reverse direction thereof can flow away via the protective diode. The protective diode can fulfill, in particular, the function of an ESD (electrostatic discharge) diode that protects the semiconductor chip against damage as a result of electrostatic discharge. In other words, charge carriers can flow away via a current path between the first connection layer and the second semiconductor layer. The risk of damage to the semiconductor chip can thus be reduced.

The first semiconductor layer and the second semiconductor layer of the semiconductor body are expediently different from one another with regard to their conduction type. By way of example, the first semiconductor layer can be embodied in p-conducting fashion and the second semiconductor layer in n-conducting fashion, or vice versa.

A diode structure in which the active region is formed is thus realized in a simple manner.

Preferably, the protective diode is formed between the first connection layer and the second semiconductor layer. The protective diode can thus be arranged in a simple manner in a current path between the first connection layer and the second semiconductor layer.

Furthermore, the protective diode can be formed outside the carrier. The formation of the protective diode can thus be effected largely independently of the properties of the carrier, in particular the electrical conductivity or the electrical contact-connectability.

The semiconductor chip furthermore preferably comprises a first contact and a second contact, which are in each case provided for externally making electrical contact with the semiconductor chip.

An operating voltage present between the first contact and the second contact brings about an injection of charge carriers from different sides of the active region into the active region. The injected charge carriers can recombine with emission of radiation in the active region.

With regard to the forward direction, the diode structure of the semiconductor body and the protective diode are expediently formed in antiparallel with respect to one another.

Through the protective diode, which is operated in the reverse direction at the operating voltage of the semiconductor chip, no or at least no significant current flow takes place in this case. By contrast, an electrical voltage present at the diode structure in the reverse direction, for instance on account of electrostatic charging, can flow away via the protective diode. The semiconductor body, in particular the active region, can thus be protected by the protective diode integrated into the semiconductor chip.

Preferably, the protective diode is embodied as a Schottky diode. A Schottky diode can be formed, in particular, by a metal-semiconductor junction, wherein the current-voltage characteristic curve of the junction deviates from an ohmic characteristic and, in particular, has an asymmetrical profile with respect to the polarity of the voltage present.

Preferably, the protective diode overlaps the semiconductor body in a plan view of the semiconductor chip. The semiconductor body, in particular the active region, can completely cover the protective diode in a plan view. The protective diode can thus be integrated into the semiconductor chip with the same lateral extent of the semiconductor body. Furthermore, the protective diode can thus be integrated into the semiconductor chip with maintenance of the area of the active region which can be utilized for generating radiation.

A lateral direction is understood to mean a direction running along a main extension plane of the semiconductor layers of the semiconductor body.

Preferably, the protective diode is formed by the second semiconductor layer. The second semiconductor layer can therefore be provided both for the injection of charge carriers into the active region and for the formation of the protective diode. A separate semiconductor region, electrically insulated from the active region, for the formation of the Schottky diode can thus be dispensed with. In other words, the protective diode, in particular in the form of a Schottky diode, can be integrated into the semiconductor chip with the same lateral extent of the semiconductor chip, without reduction of the area of the active region which is crucial for generating radiation. The integration of the protective diode into the semiconductor chip can therefore be effected without the optoelectronic properties of the semiconductor chip being impaired.

Preferably, the first connection layer runs at least in regions between the carrier and the second semiconductor layer. By the first connection layer, electrical contact can be made with the first semiconductor layer from that side of the active region which faces the carrier.

Preferably, a second connection layer is arranged at least in regions between the first connection layer and the second semiconductor layer. The second connection layer is electrically conductively connected to the second semiconductor layer and furthermore preferably directly adjoins the second semiconductor layer.

Expediently, electrical contact can be made with the first connection layer and the second connection layer externally respectively via the first and/or second contact. The first and/or the second contact can respectively be formed by means of a contact layer arranged, preferably directly, on the first and/or second connection layer. In a departure from that, the first connection layer can form the first contact and/or the second connection layer can form the second contact. Thus, in this case at least one separate contact layer provided in addition to the connection layers and forming the first and/or second contact may be dispensed with.

The first connection layer and/or the second connection layer preferably respectively contain a metal, for example Ti, Pt, Ni, Au, Ag, Al, Rh, Pd, Pt or W, or a metallic alloy comprising at least one of the materials mentioned. The first and/or the second connection layer are preferably arranged outside the semiconductor body and produced by means of a non-epitaxial method, for instance, vapor deposition or sputtering.

The protective diode may be formed by a junction layer arranged on the second semiconductor layer and furthermore preferably adjoins the second semiconductor layer. The junction layer and the second connection layer are expediently spaced apart from one another in a lateral direction. A direct electrical contact between the junction layer and the second connection layer can thus be avoided in a simple manner.

An insulation layer is furthermore preferably formed between the junction layer and the second connection layer. The risk of an electrical short circuit between the junction layer and the second connection layer can thus be more extensively reduced.

The junction layer is preferably chosen with respect to the material in such a way that a Schottky junction, that is to say, a metal-semiconductor junction having an asymmetrical current-voltage characteristic with respect to the second semiconductor layer, can be realized in a simplified manner.

Alternatively, the protective diode is formed by the first connection layer, wherein the first connection layer preferably adjoins the second semiconductor layer. In this case, therefore, the first connection layer adjoins the first semiconductor layer and the second semiconductor layer, wherein an ohmic or at least approximately ohmic contact is formed between the first connection layer and the first contact layer and a Schottky contact is formed between the first connection layer and the second contact layer.

The material for the layer adjoining the second semiconductor layer, that is to say, the junction layer or the first connection layer, is preferably chosen in such a way that a Schottky contact with respect to the second semiconductor layer can be formed in a simplified manner.

Preferably, the second semiconductor layer comprises, at least in regions, in particular in the region of the protective diode, a contact capability reduced locally in a targeted manner. Such a region of reduced contact capability can be produced for example by incineration, for instance, in an oxygen-containing plasma or sputtering. In this way, the electrical conductivity of the second semiconductor layer can be reduced in a targeted manner.

Thus, between the second semiconductor layer and the junction layer and/or the first connection layer, a contact with a sufficiently high potential barrier may be realized in a simplified manner. The freedom with regard to the material of the layer adjoining the second semiconductor layer, that is to say, of the junction layer or of the first connection layer is thus more extensively increased. In particular, the layer can contain a material or consist of a material which has a high reflectivity for radiation generated in the active region. For radiation in the visible or in the ultraviolet spectral range, silver or aluminum, for example, is distinguished by a high reflectivity.

The first contact and the second contact may also be formed on different sides of the carrier. In this case, the carrier is preferably embodied in an electrically conductive fashion.

Alternatively, the first contact and the second contact are arranged on that side of the carrier which faces the semiconductor body. In this case, the carrier can be chosen independently of its electrical conductivity and can be embodied, in particular, in an electrically insulating fashion.

By way of example, a preferably doped semiconductor material is suitable as electrically conductive carrier material. For example, the carrier can contain silicon, germanium, gallium arsenide or gallium nitride or consist of such a material.

Furthermore, by way of example, a ceramic for instance aluminum nitride or boron nitride, is suitable as carrier material. Such a carrier can be embodied in an electrically insulating fashion.

The semiconductor body is preferably cohesively connected to the carrier. In particular, the carrier is different from a growth substrate for the semiconductor layer sequence of the semiconductor body. The carrier preferably stabilizes the semiconductor layer sequence of the semiconductor body mechanically. The growth substrate of the semiconductor body is not necessary for this purpose and can be removed.

In the case of a cohesive connection, the connecting partners, which are preferably prefabricated, are held together by atomic and/or molecular forces. A cohesive connection can be obtained, for example, by a connecting layer, for instance, an adhesive layer or a solder layer. In general, a separation of the connection is accompanied by the destruction of the connecting layer and/or of at least one of the connecting partners.

Preferably, the growth substrate for the semiconductor layer sequence of the semiconductor body is removed at least in regions. In particular, the growth substrate can be thinned over the whole area or in regions or be removed over the whole area or in regions.

A semiconductor chip wherein the growth substrate is removed is also referred to as a thin-film semiconductor chip.

A thin-film semiconductor chip, for instance a thin-film light-emitting diode chip, can furthermore be distinguished by at least one of the following characteristic features:

- at a first main area—facing toward a carrier element—of a semiconductor body comprising a semiconductor layer sequence with an active region, in particular an epitaxial layer sequence, a mirror layer is applied or formed in the semiconductor layer sequence, for instance in a manner integrated as a Bragg mirror, said mirror layer reflecting at least part of the radiation generated in the semiconductor layer sequence back into the latter;
- the semiconductor layer sequence has a thickness in the range of 20 μm or less, in particular in the region of 10 μm; and/or
- the semiconductor layer sequence contains at least one semiconductor layer having at least one area having an intermixing structure which ideally leads to an approximately ergodic distribution of the light in the semiconductor layer sequence, that is to say that it has an as far as possible ergodically stochastic scattering behavior.

A basic principle of a thin-film light-emitting diode chip is described, for example, in I. Schnitzer et al., Appl. Phys. Lett. 63 (16), Oct. 18, 1993, 2174-2176, the disclosure of which is hereby incorporated by reference.

The semiconductor layer sequence of the semiconductor body is preferably deposited epitaxially, for instance by MOVPE or MBE.

The semiconductor body, in particular the active region, furthermore preferably contains a III-V semiconductor material. With III-V semiconductor materials, high internal quantum efficiencies can be achieved during the generation of radiation.

The construction described is generally suitable for optoelectronic semiconductor chips provided for generating radiation and/or for detecting radiation.

In particular, the semiconductor chip can be provided for generating incoherent, partly coherent or coherent radiation. By way of example, a construction in accordance with an LED chip is suitable for generating incoherent radiation, and a construction in accordance with an RCLED chip (resonant cavity light emitting diode) is suitable for generating partly coherent radiation. Coherent radiation can be generated by a semiconductor laser chip, for example, which can be embodied, in particular, as an edge emitting laser or as a surface emitting laser, for instance as a VCSEL (vertical cavity surface emitting laser) or as a VECSEL (vertical external cavity surface emitting laser).

In accordance with a method for producing a radiation-emitting semiconductor chip, a semiconductor body with a semiconductor layer sequence is provided, the semiconductor layer sequence comprising an active region provided for generating radiation, a first semiconductor layer and a second semiconductor layer. A recess which extends through the active region into the first semiconductor layer is formed in the semiconductor body. A first connection layer is formed on the semiconductor body, wherein the first connection layer extends into the recess. The first connection layer is electrically connected to the second semiconductor layer via a protective diode. The semiconductor chip is completed.

The method steps need not necessarily be carried out in the order of the above enumeration.

A method wherein a protective diode can be integrated into the semiconductor chip is thus realized in a simple and cost-effective manner. With this method it is possible to produce a multiplicity of semiconductor chips simultaneously, in particular alongside one another on a wafer. In this method, semiconductor chips into which a protective diode has already been integrated can emerge as a result of singulation. The integration of the protective diode can thus be effected at the wafer level, that is to say, before the semiconductor chips are actually singulated.

Preferably, a junction layer is formed before the formation of the first connection layer on the second semiconductor layer, the junction layer adjoining the second semiconductor layer. In particular, a Schottky diode can be formed by the junction layer.

Preferably, the electrical contact capability of the second semiconductor layer is locally reduced in a targeted manner. This can be effected, in particular, before the deposition of the junction layer.

In particular, the electrical contact capability can be reduced by incineration and/or sputtering.

Preferably, the second connection layer is uncovered by regional removal of the semiconductor body. In the uncovered region of the second connection layer a contact provided for making electrical contact with the semiconductor chip may be formed.

The method described is particularly suitable for producing a radiation-emitting semiconductor chip described further above. The features described in connection with the method can therefore also be used for the semiconductor chip and vice versa.

Further features, configurations and expediencies will become apparent from the following description of examples in conjunction with the figures.

Elements which are identical, of identical type or act identically are provided with identical reference symbols in the figures.

The figures are in each case schematic illustrations and therefore not necessarily true to scale. Rather, comparatively small elements and, in particular, layer thicknesses may be illustrated with an exaggerated size for clarification purposes.

Figure 1B:
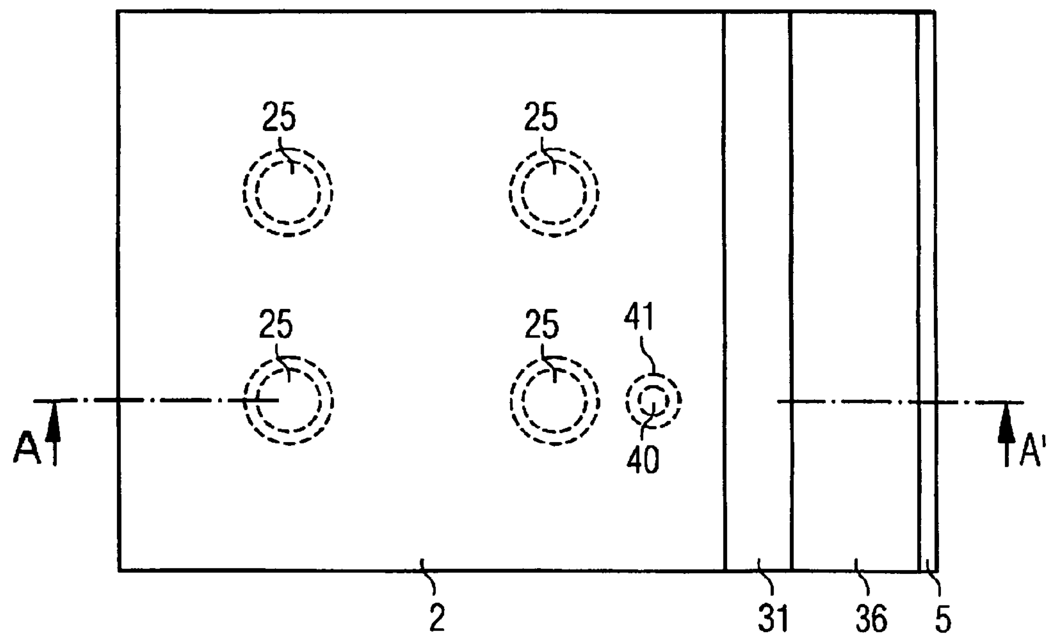

A first example of a radiation-emitting semiconductor chip is shown schematically on the basis of a plan view in FIG. 1B and an associated sectional view along the line AA' in FIG. 1A.

The radiation-emitting semiconductor chip 1 comprises a semiconductor body 2, which is fixed to a carrier 5 by means of a connecting layer 8.

The semiconductor layer sequence forming the semiconductor body 2 is preferably produced epitaxially, for instance by means of MOVPE or MBE.

The semiconductor body comprises an active region 20 provided for generating radiation, said active region being arranged between a first semiconductor layer 21 and a second semiconductor layer 22. The first semiconductor layer 21 and the second semiconductor layer 22 are different from one another with regard to their conduction type. By way of example, the second semiconductor layer 22 can be embodied in p-conducting fashion and the first semiconductor layer 21 in n-conducting fashion, or vice versa.

The semiconductor body 2 comprises a plurality of recesses 25 which extend from the carrier 5 through the second semiconductor layer 22 and the active region 20 into the first semiconductor layer 21.

The recesses 25 are in each case embodied in circular fashion in plan view, by way of example, and arranged in matrix form. However, the recesses can also have a different basic shape, for instance a polygonal, for example rectangular or square, basic shape. The recesses are expediently arranged in such a way that charge carriers can be injected into the active region uniformly from the first semiconductor layer 21 in a lateral direction. Particularly given a sufficiently high electrical conductivity of the first semiconductor layer 21 in a lateral direction, it is possible, in a departure from the exemplary embodiment described, also to provide just one individual recess.

The carrier 5 comprises a first main area 51 and a further main area 52. The first main area 51 faces the semiconductor body 2 and is preferably embodied in planar fashion. A cohesive fixing of the semiconductor body to the carrier can thus be realized in a simplified manner.

By way of example, a, preferably doped, semiconductor material is suitable as carrier material. For example, the carrier can contain silicon, germanium, gallium arsenide or gallium nitride or consist of such a material. Alternatively or supplementarily, the carrier can contain a ceramic, for instance AlN or BN.

A first connection layer 31 is formed between the semiconductor body 2 and the carrier 5, said first connection layer extending into the recesses 25. By the first connection layer, electrical contact can be made with the first semiconductor layer 21 from that side of the active region 20 which faces the carrier.

A radiation exit area 10 of the semiconductor body 2, facing away from the carrier 5, can thus be embodied in a manner free of an external electrical contact. The risk of shading of the radiation exit area by a contact which is opaque to the radiation generated in the active region can be avoided.

The side areas of the recesses 25 are provided with an insulation layer 7. An electrical short circuit of the active region 20 by the first connection layer 31 can be prevented in a simple manner.

The insulation layer 7 can contain, for example, a nitride, for instance silicon nitride, an oxide, for instance silicon oxide or titanium oxide, or an oxynitride, for instance silicon oxynitride, or consist of such a material.

The second semiconductor layer 22 is electrically conductively connected to a second connection layer 32. The second connection layer runs in regions between the first connection layer 31 and the second semiconductor layer 22.

Furthermore, the semiconductor chip 1 comprises a first contact 35 and a second contact 36. The contacts are provided for externally making electrical contact with the semiconductor chip and serve for injecting charge carriers from different sides of the active region 20 into the active region, such that the injected charge carriers can recombine in the active region with emission of radiation.

By the first connection layer 31 and the second connection layer 32, electrical contact can be made with the semiconductor body from the same side of the semiconductor body in such a way that charge carriers can be injected into the active region 20 from different sides during operation. In this way, a semiconductor chip whose radiation exit area is free of external electrical contacts can be realized in a simplified manner.

The first contact 35 is electrically conductively connected to the first connection layer 31 via the carrier 5 and the connecting layer 8. The second contact 36 is arranged on the second connection layer 32 and electrically conductively connected to the latter.

A protective diode 4 is formed between the first connection layer 31 and the second semiconductor layer 22.

The protective diode 4 is formed by a junction layer 40, which extends from the second semiconductor layer 22 in a vertical direction as far as the first connection layer 31. The protective diode 4 is embodied as a Schottky diode wherein the junction layer 40 and the second semiconductor layer 22 form a metal-semiconductor junction.

In a plan view of the semiconductor chip 1, the semiconductor body 2, in particular the active region 20, covers the protective diode 4 completely. The protective diode is therefore integrated into the semiconductor body in such a way that both the area which can be utilized for generating radiation and the lateral extent of the semiconductor chip can be maintained.

With regard to the material, the junction layer is preferably chosen in such a way that an operating voltage present in a forward direction during the operation of the semiconductor chip 1 leads to no or at least no significant current flow between the first connection layer 31 and the second semiconductor layer 22. The current paths within the semiconductor chip are explained in greater detail in connection with FIG. 2.

In the case of a semiconductor body containing $In_xGa_yAl_{1-x-y}N$ where $0 \le x \le 1$, $0 \le y \le 1$ and $x+y \le 1$, in particular where $x \ne 1$, $y \ne 1$, $x \ne 0$ and/or $y \ne 0$, a junction layer which contains TiWN or consists of such a material composition is suitable, for example.

Alternatively or supplementarily, the junction layer 40 can be embodied as a highly reflective metal layer. By way of example, silver and aluminum have a high reflectivity in the visible and ultraviolet spectral range. Radiation which is generated in the active region and emitted in the direction of the carrier 5 can thus be deflected in the direction of the radiation exit area in an efficient manner.

A cutout 41 is formed in the second connection layer 32. The junction layer 40 extends through said cutout. The side areas of the cutout 41 are covered with the insulation layer 7. An electrical short circuit between the junction layer 40 and the second connection layer 32 can thus be avoided.

The connection layers 31 and 32 preferably respectively contain a metal, for instance Ti, Pt, Ni, Au, Ag, Al, Rh, Pd, Pt or W, or a metallic alloy comprising at least one of the metals mentioned.

The first connection layer 35 and/or the second connection layer 36 can also be embodied in multilayered fashion.

Furthermore, the first connection layer 31 and/or the second connection layer 32 can also contain a TCO (transparent conductive oxide) material, for instance zinc oxide, indium oxide or indium tin oxide (ITO).

The semiconductor body 2, in particular the active region 20, preferably contains a III-V semiconductor material.

III-V semiconductor materials are particularly suitable for generating radiation in the ultraviolet ($In_xGa_yAl_{1-x-y}N$) through the visible ($In_xGa_yAl_{1-x-y}N$, in particular for blue to green radiation, or $In_xGa_yAl_{1-x-y}P$, in particular for yellow to red radiation) to the infrared ($In_xGa_yAl_{1-x-y}As$) spectral range. In this case, $0 \leq 1$, $0 \leq y \leq 1$ and $x+y \leq 1$ respectively hold true, in particular where $x \neq 1$, $y \neq 1$, $x \neq 0$ and/or $y \neq 0$. With III-V semiconductor materials, in particular composed of the material systems mentioned, high internal quantum efficiencies can furthermore be obtained during the generation of radiation.

Furthermore, the protective diode 4, in a departure from the example shown, can also be formed by the first connection layer 31, wherein the first connection layer adjoins the second semiconductor layer 22. A separate junction layer provided in addition to the first connection layer 31 can be dispensed with in this case. The first connection layer 31 can, therefore, with respect to the semiconductor body 2, firstly form an ohmic contact with respect to the first semiconductor layer 21 and secondly be electrically connected to the second semiconductor layer 22 via a Schottky contact.

An arrangement wherein the first connection layer and the junction layer are embodied in a manner spaced apart from one another is also conceivable provided that the connection layer and the junction layer are electrically conductively connected, for example, via the carrier or via the connecting layer.

Furthermore, the electrical contact capability of the second semiconductor layer can in regions, in particular in the region of the protective diode 4, be reduced locally in a targeted manner (not explicitly illustrated in FIG. 1A). The freedom in the choice of the material for the layer adjoining the second semiconductor layer 22, that is to say the junction layer 40 or the first connection layer 31, is thus increased.

In a departure from the example described, the contacts 35 and 36 can also be arranged on the same side of the carrier 5, in particular on the first main area 51. In this case, the carrier 5 can also be embodied in an electrically insulating fashion.

In the example shown, the semiconductor chip 1 is embodied as a thin-film semiconductor chip, wherein the growth substrate for the semiconductor layer sequence of the semiconductor body 2 is removed. In a departure from that, however, the growth substrate can also be removed only in regions or be thinned over the whole area or in regions.

Furthermore, the semiconductor chip can also be embodied as an RCLED or as a semiconductor laser chip, in particular as a VCSEL or as a VECSEL.

Figure 2:
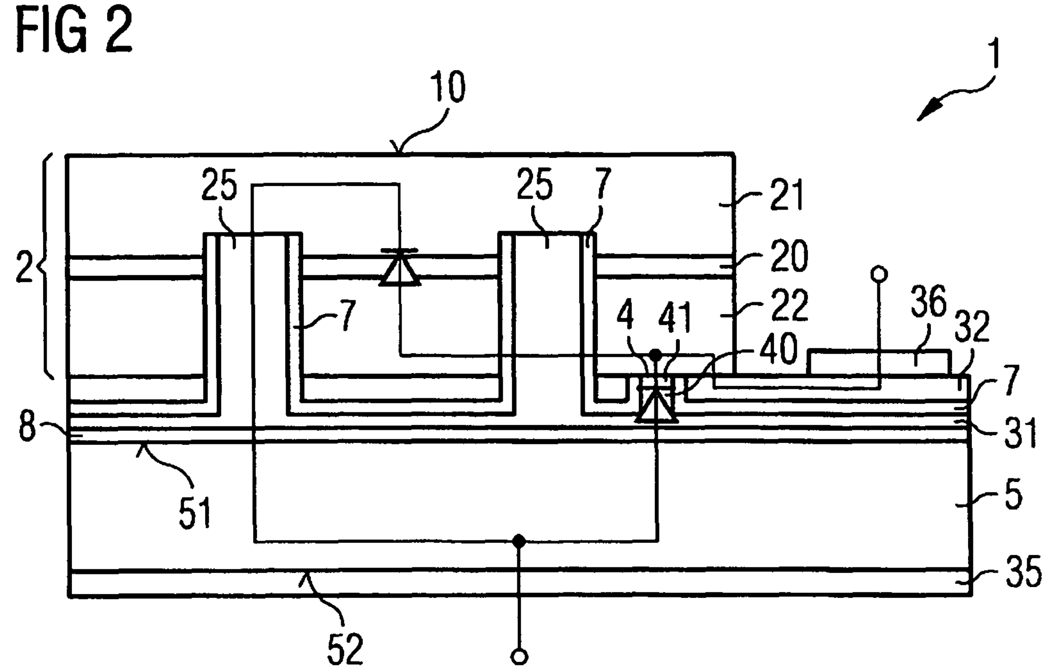
FIG. 2 shows a schematic illustration of the current paths in a semiconductor chip in accordance with a first example illustrated in FIGS. 1A and 1B.

The current paths in the semiconductor chip 1 are illustrated schematically in FIG. 2. In this case, the first semiconductor layer 21 and the carrier 5 are doped in n-conducting fashion, by way of example, and the second semiconductor layer 22 is doped in p-conducting fashion.

When a positive electrical voltage is present at the second contact 36 relative to the first contact 35, the diode structure of the semiconductor body 2 that is provided for generating radiation is operated in the forward direction, such that charge carriers are injected into the active region 20 and can recombine there with emission of radiation.

The protective diode 4 is connected in the reverse direction, by contrast, given this polarity. Therefore, no or at least no significant portion of the operating current between the contacts 35, 36 of the semiconductor chip flows through the junction layer 40.

In the case of electrostatic charging of the semiconductor chip in the reverse direction, however, charge carriers can flow away via the current path between the first contact 35 and the second contact 36 via the protective diode 4. Charge carriers can therefore pass from the first connection layer 31 via the protective diode 4 into the second semiconductor layer 22 in a manner bypassing the active region 20. The diode structure of the semiconductor chip which is provided for generating radiation, in particular the active region 20, is therefore not loaded as the charge carriers flow away.

The risk of damage to the semiconductor chip 1 can thus be reduced. A protective diode which is formed outside the semiconductor chip and is connected in antiparallel with the first contact 35 and second contact 36 of the semiconductor chip can thus be dispensed with.

In the alternative case where the first semiconductor layer 21 and the carrier 5 are doped in p-conducting fashion and the second semiconductor layer 22 is doped in n-conducting fashion, the semiconductor chip can be correspondingly operated such that a positive voltage is present at the first contact 35 relative to the second contact 36.

An example of a method for producing a radiation-emitting semiconductor chip is shown in FIGS. 3A to 3E on the basis of intermediate steps illustrated schematically in sectional view.

A semiconductor body 2 with a semiconductor layer sequence comprising an active region 20, a first semiconductor layer 21 and a second semiconductor layer 22 is provided. The semiconductor layer sequence forming the semiconductor body 2 is preferably deposited epitaxially on a growth substrate 200.

Figure 3A:
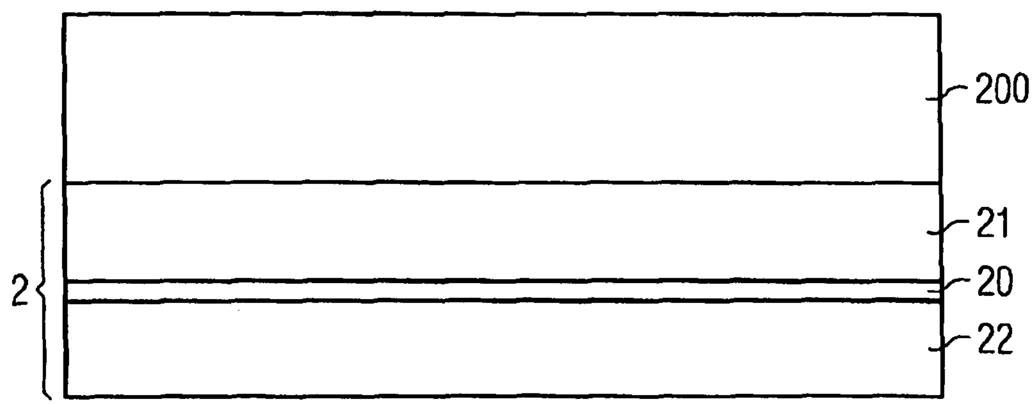
FIGS. 3A to 3F show an example of a method for producing a radiation-emitting semiconductor chip on the basis of intermediate steps each illustrated in schematic sectional view.
Figure 3B:
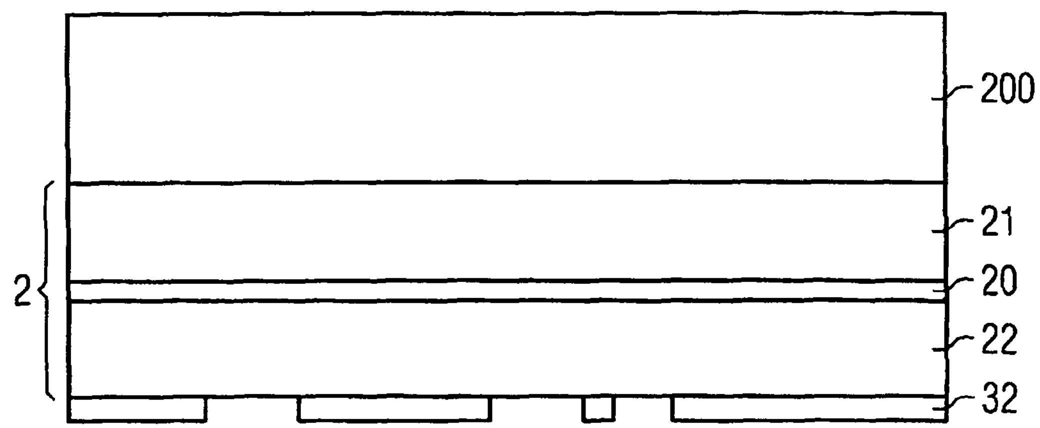

As illustrated in FIG. 3B, a second connection layer is formed on the second semiconductor layer 22. This can be effected by vapor deposition or sputtering, for example.

The second connection layer 32 is embodied such that it is structured locally, for example, by lithographic techniques in such a way that the second semiconductor layer 22 is uncovered in regions.

Figure 3C:
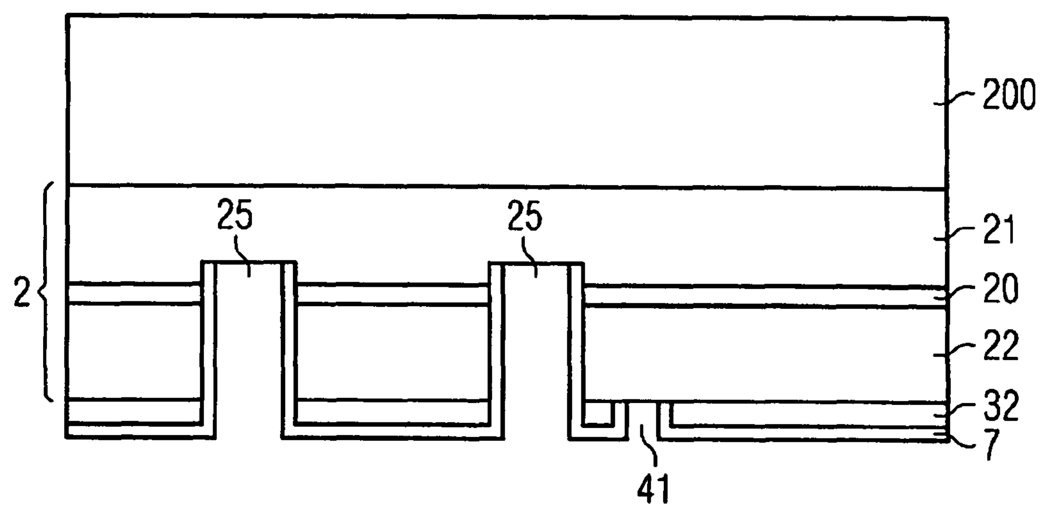

As illustrated in FIG. 3C, recesses 25 are formed in the semiconductor body 2, the recesses extending through the second semiconductor layer 22 and the active region 20 into the first semiconductor layer 21. The semiconductor body 2 is subsequently provided with an insulation layer 7 which covers the second connection layer 32 and, in particular, the side areas of the cutout 41 and of the recesses 25.

Figure 3D:
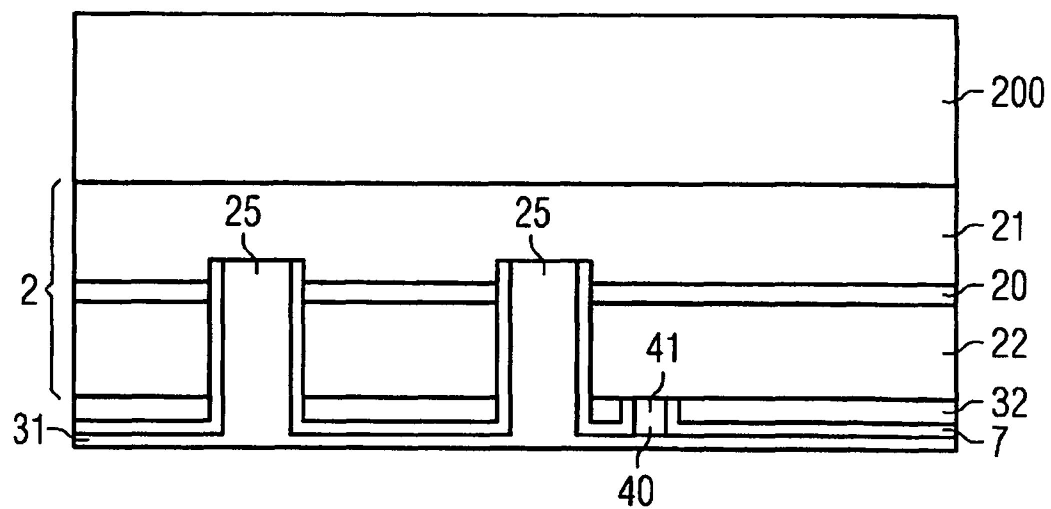
Figure 3E:
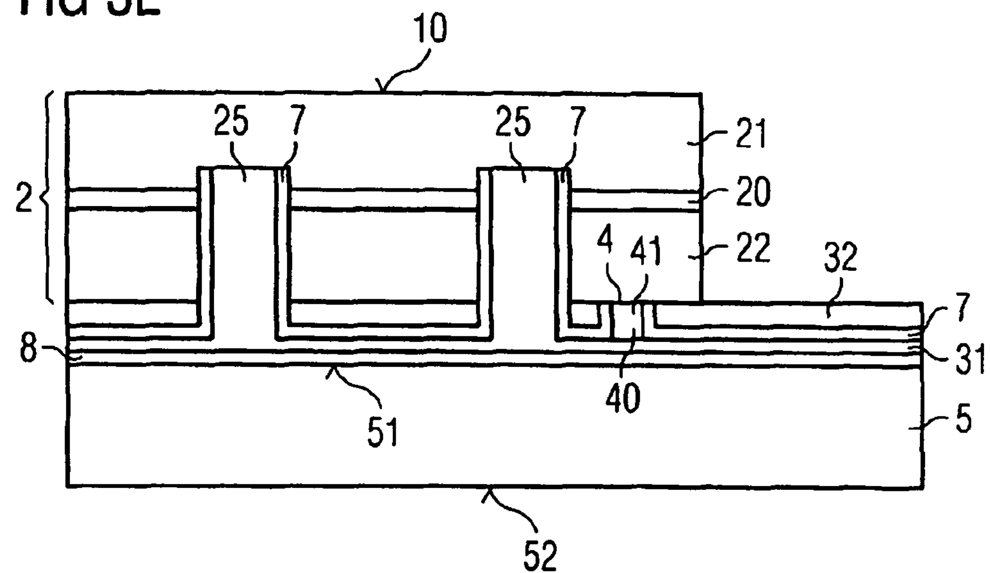

A junction layer 40 is formed in the cutout 41. The junction layer 40 can be applied by vapor deposition or sputtering, for example. As illustrated in FIG. 3D, a first connection layer 31 is subsequently deposited on the insulation layer 7, the first connection layer extending into the recesses 25 and furthermore directly adjoining the junction layer 40.

The semiconductor body 2 can subsequently be cohesively connected to a carrier 5. This can be effected by a connecting layer 8 which can contain, for example, a solder or an electrically conductive adhesive.

By the carrier 5, the semiconductor layer sequence of the semiconductor body 2 can be mechanically stabilized. The growth substrate 200 is no longer required for this purpose and can be removed.

The removal of the growth substrate can be effected for example mechanically, for instance by grinding, polishing or lapping, and/or chemically, for instance by wet-chemical or dry-chemical etching. Alternatively or supplementarily, a laser lift-off method can also be used.

Material of the semiconductor body 2 is removed in regions to thus uncover the second connection layer 32 in regions.

Figure 3F:
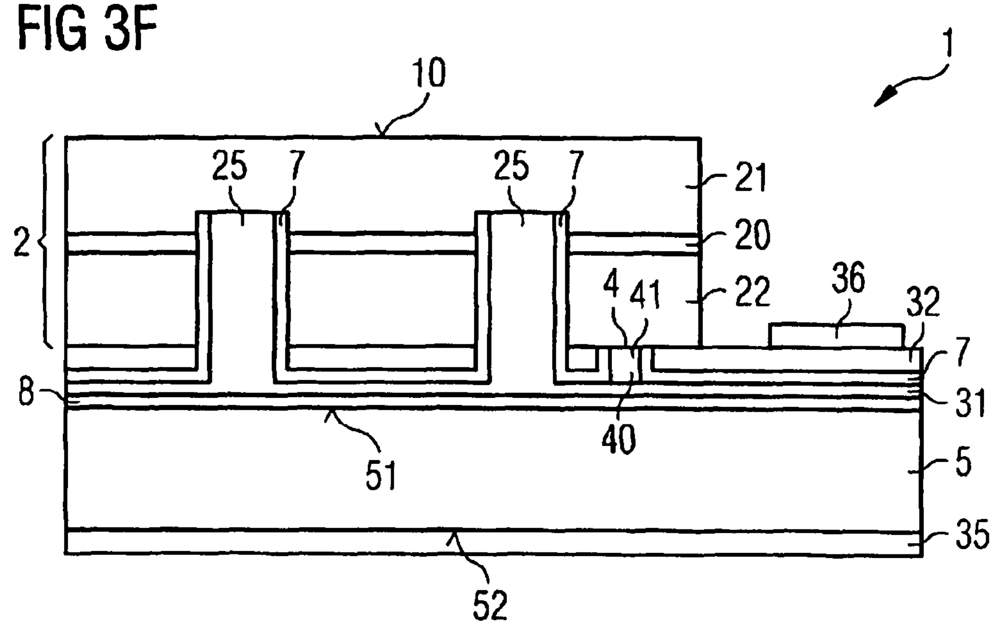

A first contact 35 and a second contact 36 are respectively deposited on the second main area 52 of the carrier 5, the second main area facing away from the semiconductor body 2, and on the second connection layer 32. This can be effected by deposition or sputtering, for example. The completed semiconductor chip, embodied in the manner described in connection with FIGS. 1A and 1B, is illustrated in FIG. 3F.

Integration of the protective diode 4 into the semiconductor chip 1 can be realized without significant additional outlay by the method described.

In a departure from the example shown, the electrical contact capability of the semiconductor body 2, in particular of the second semiconductor layer 22, can be locally reduced in a targeted manner before the deposition of the junction layer 40. This is preferably effected before the deposition of the first connection layer. The reduction of the contact capability can be effected, for example, by incineration, for instance in an $O_2$ plasma, or sputtering. The electrical conductivity can thus be reduced locally in the region of the cutout 41 in a targeted manner.

The production method described has been shown, merely by way of example for the production of one semiconductor chip. During production, the semiconductor layer sequence can be provided on a wafer, wherein a multiplicity of semiconductor bodies can emerge from the semiconductor layer sequence by singulation. The singulation can be effected by sawing, breaking, cutting or etching, for example.

This disclosure is not restricted by the descriptions on the basis of the examples. Rather, the disclosure encompasses any novel feature and also any combination of features, which in particular includes any combination of features in the appended claims, even if this feature or this combination itself is not explicitly specified in the claims or the examples.

The invention claimed is:

1. A radiation-emitting semiconductor chip comprising:

a carrier and a semiconductor body with a semiconductor layer sequence comprising an active region that generates radiation, a first semiconductor layer and a second semiconductor layer;

wherein the active region is arranged between the first semiconductor layer and the second semiconductor layer;

the first semiconductor layer is arranged on a side of the active region which faces away from the carrier;

the semiconductor body comprises at least one recess which extends through the active region;

the first semiconductor layer is electrically conductively connected to a first connection layer extending in the recess from the first semiconductor layer in a direction of the carrier;

the first connection layer is electrically connected to the second semiconductor layer via a protective diode which is a Schottky diode; and the active region completely covers the protective diode in a plan view of the chip.

2. The radiation-emitting semiconductor chip as claimed in claim 1, wherein the first connection layer runs at least in regions between the carrier and the second semiconductor layer.

3. The radiation-emitting semiconductor chip as claimed in claim 1, wherein the protective diode overlaps the semiconductor body in a plan view of the semiconductor chip.

4. The radiation-emitting semiconductor chip as claimed in claim 1, wherein the protective diode is formed by the second semiconductor layer.

5. The radiation-emitting semiconductor chip as claimed in claim 1, further comprising a second connection layer arranged at least in regions between the first connection layer and the second semiconductor layer, said second connection layer being electrically conductively connected to the second semiconductor layer.

6. The radiation-emitting semiconductor chip as claimed in claim 5, wherein the protective diode is formed by a junction layer adjoining the second semiconductor layer, and an insulation layer is formed between the junction layer and the second connection layer.

7. The radiation-emitting semiconductor chip as claimed in claim 1, wherein the protective diode is formed by a region of the first connection layer, the region adjoining the second semiconductor layer.

8. The radiation-emitting semiconductor chip as claimed in claim 1, wherein a growth substrate for the semiconductor layer sequence of the semiconductor body is removed at least in regions.

9. The radiation-emitting semiconductor chip as claimed in claim 1, which is an LED chip, an RCLED chip or a laser diode chip.

10. The radiation-emitting semiconductor chip as claimed in claim 1, wherein the recess does not extend completely through the first semiconductor layer.

11. The radiation-emitting semiconductor chip as claimed in claim 1, wherein an entire radiation exit area of the semiconductor body facing away from the carrier is free of electrical contact material that is opaque to radiation generated in the active region.

12. A method of producing the radiation-emitting semiconductor chip of claim 1, comprising:

a) providing a semiconductor body with a semiconductor layer sequence comprising an active region that generates radiation, a first semiconductor layer and a second semiconductor layer;

b) forming a recess in the semiconductor body which extends through the active region into the First semiconductor layer c) forming, a first connection layer on the semiconductor body, the first connection layer extends into the recess, and the first connection layer is electrically connected to the second semiconductor layer via a protective diode; and d) completing the semiconductor chip.

13. The method as claimed in claim 12, wherein, before step c), a junction layer is formed on the second semiconductor layer, said junction layer adjoining the second semiconductor layer.

14. The method as claimed in claim 13, wherein an electrical contact capability of the second semiconductor layer is locally reduced in a targeted manner.

15. The method as claimed in claim 14, wherein the electrical contact capability is reduced by incineration and/or sputtering.

16. The method as claimed in claim 12, wherein the second connection layer is uncovered by regional removal of the semiconductor body.

17. A radiation-emitting semiconductor chip comprising:
a carrier and
a semiconductor body with a semiconductor layer sequence comprising an active region that generates radiation, a first semiconductor layer and a second semiconductor layer;
wherein the active region is arranged between the first semiconductor layer and the second semiconductor layer;
the first semiconductor layer is arranged on a side of the active region which faces away from the carrier;
the semiconductor body comprises at least one recess which extends through the active region and does not extend completely through the first semiconductor layer;
the first semiconductor layer is electrically conductively connected to a first connection layer extending in the recess from the first semiconductor layer in a direction of the carrier;
the first connection layer is electrically connected to the second semiconductor layer via a protective diode; and
the active region completely covers the protective diode in a plan view of the chip.

18. The radiation-emitting semiconductor chip as claimed in claim 17, wherein the first connection layer runs at least in regions between the carrier and the second semiconductor layer.

19. The radiation-emitting semiconductor chip as claimed in claim 17, further comprising a second connection layer arranged at least in regions between the first connection layer and the second semiconductor layer, said second connection layer being electrically conductively connected to the second semiconductor layer.

20. A method of producing the radiation-emitting semiconductor chip of claim 19, comprising;
providing a semiconductor body with a semiconductor layer sequence comprising an active region that generates radiation, a first semiconductor layer and a second semiconductor layer;
b) forming a recess in the semiconductor body which extends through the active region into the first semiconductor layer;
c) forming a first connection layer on the semiconductor body, the first connection layer extends into the recess, and the first connection layer is electrically connected to the second semiconductor layer via a protective diode; and
d) completing the semiconductor chip.

21. A radiation-emitting semiconductor chip comprising:
a carrier and
a semiconductor body with a semiconductor layer sequence comprising an active region that generates radiation, a first semiconductor layer and a second semiconductor layer;
wherein the active region is arranged between the first semiconductor layer and the second semiconductor layer;
the first semiconductor layer is arranged on a side of the active region which faces away from the carrier;
the semiconductor body comprises at least one recess which extends through the active region;
the first semiconductor layer is electrically conductively connected to a first connection layer extending in the recess from the first semiconductor layer in a direction of the carrier;
an entire radiation exit area of the semiconductor body facing away from the carrier is free of electrical contact material that is opaque to radiation generated in the active region;
the first connection layer is electrically connected to the second semiconductor layer via a protective diode; and
the active region completely covers the protective diode in a plan view of the chip.

22. The radiation-emitting semiconductor chip as claimed in claim 21, wherein the first connection layer runs at least in regions between the carrier and the second semiconductor layer.

23. The radiation-emitting semiconductor chip as claimed in claim 21, further comprising a second connection layer arranged at least in regions between the first connection layer and the second semiconductor layer, said second connection layer being electrically conductively connected to the second semiconductor layer.

24. A method of producing the radiation-emitting semiconductor chip of claim 21, comprising:
a) providing a semiconductor body with a semiconductor layer sequence comprising an active region that generates radiation, a first semiconductor layer and a second semiconductor layer;
b) forming a recess in the semiconductor body which extends through the active region into the first semiconductor layer;
c) forming a first connection layer on the semiconductor body, the first connection layer extends into the recess, and the first connection layer is electrically connected to the second semiconductor layer via a protective diode; and
d) completing the semiconductor chip.

* * * * *

UNITED STATES PATENT AND TRADEMARK OFFICE

CERTIFICATE OF CORRECTION

PATENT NO. : 8,710,537 B2
APPLICATION NO. : 12/922736
DATED : April 29, 2014
INVENTOR(S) : Engl et al.

It is certified that error appears in the above-identified patent and that said Letters Patent is hereby corrected as shown below:

In the Claims

In Column 13

In claim 20, at line 41, please change “claim 19” to --claim 17--.

Signed and Sealed this
Twentieth Day of January, 2015

Michelle K. Lee

Michelle K. Lee
*Deputy Director of the United States Patent and Trademark Office*